(12) United States Patent
Lee et al.

(10) Patent No.: US 10,784,837 B2
(45) Date of Patent: Sep. 22, 2020

(54) BULK ACOUSTIC WAVE RESONATOR

(71) Applicant: Samsung Electro-Mechanics Co., Ltd., Suwon-si (KR)

(72) Inventors: Tae Hun Lee, Suwon-si (KR); Chang Hyun Lim, Suwon-si (KR); Tae Yoon Kim, Suwon-si (KR); Moon Chul Lee, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 349 days.

(21) Appl. No.: 15/814,869

(22) Filed: Nov. 16, 2017

(65) Prior Publication Data

US 2018/0337656 A1    Nov. 22, 2018

(30) Foreign Application Priority Data

May 18, 2017    (KR) .......................... 10-2017-0061417

(51) Int. Cl.
*H03H 9/12* (2006.01)
*H03H 9/125* (2006.01)
(Continued)

(52) U.S. Cl.
CPC .............. *H03H 9/125* (2013.01); *H03H 9/13* (2013.01); *H03H 9/171* (2013.01); *H03H 9/174* (2013.01); *H03H 9/205* (2013.01)

(58) Field of Classification Search
CPC .......... H03H 9/125; H03H 9/13; H03H 9/171; H03H 9/174; H03H 9/0504; H03H 9/0514; H03H 9/0538
(Continued)

(56) References Cited

U.S. PATENT DOCUMENTS 7,161,283 B1 *   1/2007   Geefay .................... H03H 3/02
                                              310/348
2005/0218488 A1 * 10/2005  Matsuo ............... B81C 1/00095
                                              257/678
(Continued)

FOREIGN PATENT DOCUMENTS

JP           4227460 B2      2/2009
KR     10-2004-0084478 A    10/2004
(Continued)

OTHER PUBLICATIONS

Korean Office Action dated Mar. 28, 2018 in corresponding Korean Patent Application No. 10-2017-0061417 (6 pages in English and 6 pages in Korean).

*Primary Examiner* — Derek J Rosenau
(74) *Attorney, Agent, or Firm* — NSIP Law

(57) ABSTRACT

A bulk acoustic wave resonator includes a substrate including a first via and a second via, a lower electrode connection member, a lower electrode, a piezoelectric layer, an upper electrode, and an upper electrode connection member spaced apart from the lower electrode connection member. The lower electrode, the piezoelectric layer, and the upper electrode constitute a resonant portion. The lower electrode connection member electrically connects the lower electrode to the first via and supports a first edge portion of the resonant portion. The upper electrode connection member electrically connects the upper electrode to the second via and supports a second edge portion of the resonant portion. Either one or both of the upper electrode connection member and the lower electrode connection member includes a respective extension portion connected to a respective one of the first via and the second via that is disposed below the resonant portion.

20 Claims, 2 Drawing Sheets

(51) Int. Cl.
*H03H 9/17* (2006.01)
*H03H 9/13* (2006.01)
*H03H 9/205* (2006.01)

(58) Field of Classification Search
USPC .................................................. 310/320, 365
See application file for complete search history.

(56) References Cited

U.S. PATENT DOCUMENTS

2007/0013268 A1\* 1/2007 Kubo ....................... H03H 3/02
310/324
2007/0090725 A1 4/2007 Kamiyama et al.
2017/0077898 A1 3/2017 Park et al.

FOREIGN PATENT DOCUMENTS

| KR | 10-0473871 B1 | 3/2005 |
| KR | 10-2017-0031431 A | 3/2017 |
| WO | WO 02/39537 A1 | 5/2002 |

\* cited by examiner

BULK ACOUSTIC WAVE RESONATOR

CROSS-REFERENCE TO RELATED APPLICATION(S)

This application claims the benefit under 35 USC 119(a) of Korean Patent Application No. 10-2017-0061417 filed on May 18, 2017, in the Korean Intellectual Property Office, the entire disclosure of which is incorporated herein by reference for all purposes.

BACKGROUND

1. Field

This application relates to a bulk acoustic wave resonator.

2. Description of Related Art

As demands for bandwidth have increased, telecommunications companies have continuously demanded high performance and stabilization of device characteristics as well as miniaturization in manufacturing bulk acoustic wave resonators and microelectromechanical system (MEMS) devices.

In detail, as the usage of bandwidth and different bands increase, band gaps between bands need to be gradually reduced.

In addition, such a phenomenon causes in-band gaps and gaps between bands to be narrowed due to a lack of frequency resources, leading to a need for interference prevention.

To improve such characteristics, there is a need to suppress insertion loss, significantly reduce inter-band interference, and prevent the occurrence of in-band notches.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a bulk acoustic wave resonator includes a substrate including a first via and a second via; a lower electrode connection member disposed on the substrate; a lower electrode disposed on the lower electrode connection member; a piezoelectric layer disposed on the lower electrode; an upper electrode disposed on the piezoelectric layer; and an upper electrode connection member disposed on the substrate spaced apart from the lower electrode connection member, wherein the lower electrode, the piezoelectric layer, and the upper electrode constitute a resonant portion, the lower electrode connection member electrically connects the lower electrode to the first via and supports a first edge portion of the resonant portion, the upper electrode connection member electrically connects the upper electrode to the second via and supports a second edge portion of the resonant portion, either one or both of the first via and the second via is disposed below the resonant portion, and either one or both of the lower electrode connection member and the upper electrode connection member includes a respective extension portion connected to a respective one of the first via and the second via that is disposed below the resonant portion.

The lower electrode connection member may include an extension portion connected to the first via, and the upper electrode connection member may include an extension portion connected to the second via.

Both the first via and the second via both may be disposed below the resonant portion.

One of the first via and the second via may disposed below the resonant portion, and a remaining one of the first via and the second via may be disposed outside an area below the resonant portion.

The upper electrode connection member may include an upper electrode connection support portion connected to the upper electrode and supporting the second edge portion of the resonant portion; and an extension portion extending from the upper electrode connection support portion parallel to an upper surface of the substrate and connected to the second via.

The lower electrode connection member may include a lower electrode connection support portion connected to the lower electrode and supporting the first edge portion of the resonant portion; and an extension portion extending from the lower electrode connection support portion parallel to an upper surface of the substrate and connected to the first via.

The lower electrode connection member, the upper electrode connection member, and the resonant portion may form a cavity; and the resonant portion may further include a membrane layer covering the cavity.

The upper electrode may include a connection portion electrically connecting the upper electrode to the upper electrode connection member.

The upper electrode connection member may include an upper electrode connection support portion supporting the second edge portion of the resonant portion; a column portion extending upwardly from an edge portion of the upper electrode connection support portion; a plate portion extending from an end portion of the column portion parallel to an upper surface of the substrate; and a connection portion disposed on an upper surface of the upper electrode and connected to the plate portion.

A portion of the upper electrode connection support portion may be disposed outside an area below the resonant portion, and the column portion may be disposed on an edge portion of the portion of the upper electrode connection support portion disposed outside the area below the resonant portion.

In another general aspect, a bulk acoustic wave resonator includes a substrate including a first via, a second via, and a third via; a first lower electrode connection member disposed on the substrate and connected to the first via; an upper electrode connection member disposed on the substrate spaced apart from the first lower electrode connection member and connected to the third via; a second lower electrode connection member disposed on the substrate spaced apart from the first lower electrode connection member and the upper electrode connection member and connected to the second via; a first resonant portion electrically connected to the first lower electrode connection member and the upper electrode connection member, and having a lower surface supported by the first lower electrode connection member and the upper electrode connection member; and a second resonant portion electrically connected to the second lower electrode connection member and the upper electrode connection member, and having a lower surface supported by the second lower electrode connection member and the upper electrode connection member, wherein any one or any combination of any two or more of the first lower electrode connection member, the second lower electrode connection member, and the upper electrode connection member may include a respective extension portion connected to a respective one of the first via, the second via, and the third via, and any one or any combination of any two or more of the first via, the second via, and the third via is disposed below either one or both of the first resonant portion and the second resonant portion.

The first lower electrode connection member may include a first lower electrode connection support portion supporting the lower surface of the first resonant portion; and an extension portion extending from the first lower electrode connection support portion parallel to an upper surface of the substrate and connected to the first via.

The second lower electrode connection member may include a second lower electrode connection support portion supporting the lower surface of the second resonant portion; and an extension portion extending from the second lower electrode connection support portion parallel to an upper surface of the substrate and connected to the second via.

The upper electrode connection member may have a columnar shape.

The first resonant portion may include a first lower electrode connected to the first lower electrode connection member; a first piezoelectric layer, at least a portion of which is disposed on an upper surface of the first lower electrode; and a first upper electrode, at least a portion of which is disposed on an upper surface of the first piezoelectric layer, the first upper electrode being connected to the upper electrode connection member; and the second resonant portion include a second lower electrode connected to the second lower electrode connection member; a second piezoelectric layer, at least a portion of which is disposed on an upper surface of the second lower electrode; and a second upper electrode, at least a portion of which is disposed on an upper surface of the second piezoelectric layer, the second upper electrode being connected to the upper electrode connection member.

The first resonant portion may further include a first membrane layer having edge portions supported by the first lower electrode connection member and the upper electrode connection member, and the second resonant portion may further include a second membrane layer having edge portions supported by the second lower electrode connection member and the upper electrode connection member.

In another general aspect, a bulk acoustic wave resonator includes a substrate; a lower electrode connection member disposed on the substrate; an upper electrode connection member disposed on the substrate and spaced apart from the lower electrode member; a resonant portion having a first end supported by the lower electrode support member and a second end supported by the upper electrode connection member, the resonant portion including a lower electrode connected to the lower electrode connection member, an upper electrode connected to the upper electrode connection member, and a piezoelectric layer disposed between the lower electrode and the upper electrode; wherein either one or both of the lower electrode connection member and the upper electrode connection member includes an electrode support portion disposed on the substrate and supporting one end of the resonant portion; and an extension portion disposed on the substrate and connected to the electrode support portion, the extension portion having a height less than a height of the electrode support portion and not contacting the resonant portion.

The substrate may include a first via and a second via; the lower electrode connection member may include a lower electrode support portion disposed on the substrate, supporting the first end of the resonant portion, and connected to the lower electrode; and a first extension portion disposed on the substrate and connected to the first via and the lower electrode support portion, the first extension portion having a height less than a height of the lower electrode support portion and not contacting the resonant portion; the upper electrode connection member may include an upper electrode support portion disposed on the substrate, supporting the second end of the resonant portion, and connected to the upper electrode; and a second extension portion disposed on the substrate and connected to the second via and the upper electrode support portion, the second extension portion having a height less than a height of the upper electrode support portion and not contacting the resonant portion; and either one or both of the first extension and the second extension may be disposed below the resonant portion.

Both the first extension and the second extension may be disposed below the resonant portion.

One of the first extension and the second extension may be disposed below the resonant portion, and a remaining one of the first extension and the second extension may not be disposed below the resonant portion.

Other features and aspects will be apparent from the following detailed description, the drawings, and the claims

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

Figure 1:
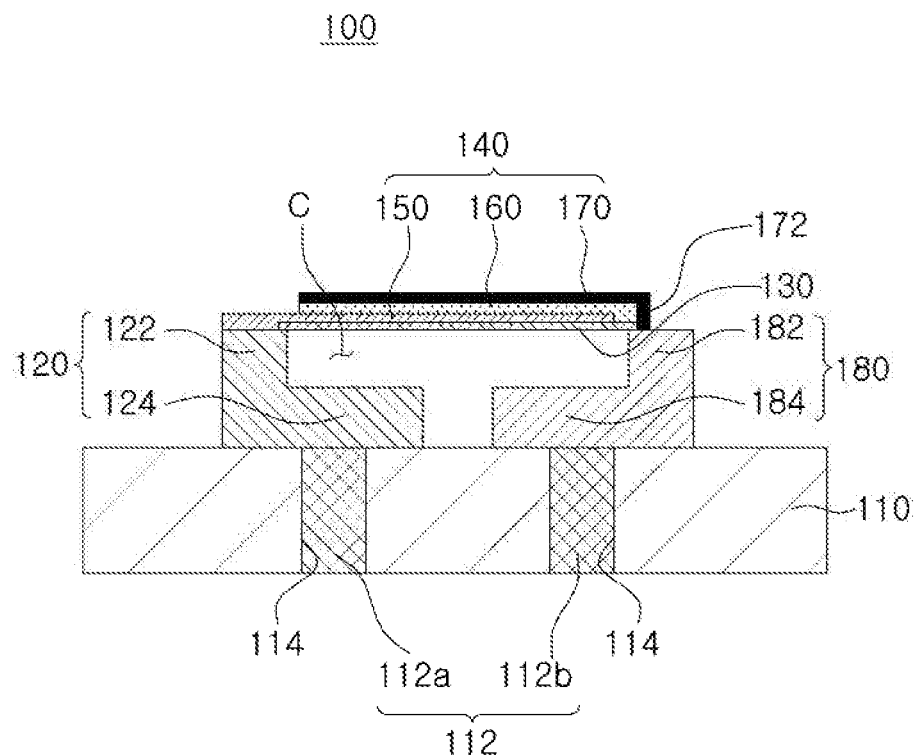
FIG. 1 illustrates a schematic configuration of an example of a bulk acoustic wave resonator.

FIG. 1 illustrates a schematic configuration of an example of a bulk acoustic wave resonator.

Referring to FIG. 1, a bulk acoustic wave resonator 100 includes a substrate 110, a lower electrode connection member 120, a membrane layer 130, a resonant portion 140, and an upper electrode connection member 180.

The substrate 110 may be a silicon substrate. For example, a silicon wafer may be used as the substrate 110. A substrate protective layer (not shown) may be provided on the substrate 110.

Via holes 114 are formed in the substrate 110. Vias 112 are formed of a conductive material below the resonant portion 140 in the via holes 114. The vias 112 include a first via 112a connected to the lower electrode connection member 120, and a second via 112b connected to the upper electrode connection member 180. The first and second vias 112a and 112b are disposed below the resonant portion 140.

When the substrate 110 is mounted on a main substrate (not shown), solder balls are disposed between the first and second vias 112a and 112b and traces on the main substrate and are reflowed to join the first and second vias 112a and 112b to the traces on the main substrate, thereby mounting the substrate 110 on the main substrate. In the example in FIG. 1, the vias 112 include two vias, but the number of the vias 112 is not limited thereto. For example, the vias 112 may include three or more vias.

The lower electrode connection member 120 is disposed on the substrate 110 and supports an edge portion of the resonant portion 140. The lower electrode connection member 120 is electrically connected to a lower electrode 150 of the resonant portion 140, and is electrically connected to the first via 112a. Thus, the lower electrode 150 and the first via 112a are electrically connected to each other through the lower electrode connection member 120.

The lower electrode connection member 120 includes a lower electrode connection support portion 122 supporting an edge portion of the resonant portion 140 and connected to the lower electrode 150, and an extension portion 124 extending from the lower electrode connection support portion 122 parallel to an upper surface of the substrate 110 and connected to the first via 112a.

Since the lower electrode connection member 120 includes the extension portion 124 as described above, a position of the first via 112a electrically connected to the lower electrode 150 of the resonant portion 140 through the lower electrode connection member 120 may be changed, thereby increasing the degree of freedom of a position at which the first via 112a may be formed.

The lower electrode connection member 120 is made of a conductive material, such as copper (Cu) or tungsten (W), for example.

The membrane layer 130 forms a cavity C together with the lower electrode connection member 120 and the upper electrode connection member 180. The membrane layer 130 is disposed so that edge portions thereof are supported by the lower electrode connection member 120 and the upper electrode connection member 180. As an example, the membrane layer 130 may be formed of a material, such as silicon dioxide ($SiO_2$) or aluminum nitride (AlN), having a relatively low reactivity with a halide-based etching gas. For example, the membrane layer 130 may be formed of either one or both of silicon dioxide ($SiO_2$) or aluminum nitride (AlN).

The resonant portion 140 is disposed on the membrane layer 130 and connected to the lower electrode connection member 120 and the upper electrode connection member 180. In the example in FIG. 1, the resonant portion 140 includes the lower electrode 150, a piezoelectric layer 160, and an upper electrode 170.

The lower electrode 150 is disposed on the membrane layer 130 and connected to the lower electrode connection member 120. The lower electrode 150 is disposed above the cavity C. As an example, the lower electrode 150 is made of a conductive material, such as molybdenum (Mo), ruthenium (Ru), tungsten (W), iridium (Ir), platinum (Pt), or any other suitable conductive material, or an alloy of any two or more of these conductive materials.

The piezoelectric layer 160 is disposed on the lower electrode 150 and the membrane layer 130, and has one side coplanar with one side of the membrane layer 130.

As an example, the piezoelectric layer 160 may be formed by depositing aluminum nitride, doped aluminum nitride, zinc oxide, or lead zirconate titanate on the lower electrode 150 and the membrane layer 130.

If the piezoelectric layer 160 is made of aluminum nitride (AlN), it may further include a rare earth metal. As the rare earth metal, for example, any one or any combination of any two or more of scandium (Sc), erbium (Er), yttrium (Y), and lanthanum (La) may be used. In addition, the piezoelectric layer 160 made of aluminum nitride (AlN) may further include a transition metal. For example, as the transition metal, any one or any combination of any two or more of zirconium (Zr), titanium (Ti), magnesium (Mg), and hafnium (Hf) may be used. Thus, the piezoelectric layer 160 made of aluminum nitride (AlN) may include one or more rare earth metals, or one or more transition metals, or both one or more rare earth metals and one or more transition metals.

The upper electrode 170 is disposed on an upper surface of the piezoelectric layer 160. As an example, the upper electrode 170 is made of a conductive material, such as molybdenum (Mo), ruthenium (Ru), tungsten (W), iridium (Ir), platinum (Pt), or any other suitable conductive material, or an alloy or any two or more of these conductive materials, in the same manner as the lower electrode 150.

The upper electrode 170 is disposed on the piezoelectric layer 160 so that the upper electrode 170 is disposed above the cavity C. In the example in FIG. 1, the upper electrode 170 covers an entire upper surface of the piezoelectric layer 160. However, in another example, the upper electrode 170 covers only a portion of the upper surface the piezoelectric layer 160 so that a remaining portion of the upper surface of the piezoelectric layer 160 is exposed. A portion of the upper electrode 170 covers a side surface of the piezoelectric layer 160. In the example in FIG. 1, the upper electrode 170 includes a connection portion 172 that covers the side surface of the piezoelectric layer 160 and electrically connects the upper electrode 170 to the upper electrode connection member 180.

The upper electrode connection member 180 is disposed on the substrate 110, and has one end connected to the upper electrode 170. The upper electrode connection member 180 and the lower electrode connection member 120 support edge portions of the resonant portion 140.

In the example in FIG. 1, the cavity C is formed by the upper electrode connection member 180, the lower electrode connection member 120, and the membrane layer 130.

The upper electrode connection member 180 includes an upper electrode connection support portion 182 supporting an edge portion of the resonant portion 140 and connected to the upper electrode 170, and an extension portion 184 extending from the upper electrode connection support portion 182 parallel to an upper surface of the substrate 110 and connected to the second via 112b.

Since the upper electrode connection member 180 includes the extension portion 184 as described above, a position of the second via 112b electrically connected to the upper electrode 170 of the resonant portion 140 through the upper electrode connection member 180 may be changed, thereby increasing the degree of freedom of a position at which the second via 112b may be formed.

The upper electrode connection member 180 is made of a conductive material such as copper (Cu) or tungsten (W), for example.

As described above, the degree of freedom of positions at which the vias 112 may be formed is increased by the lower electrode connection member 120 having the extension portion 124 and the upper electrode connection member 180 having the extension portion 184.

Thus, an area occupied by the bulk acoustic wave resonator 100 may be reduced.

Figure 2:
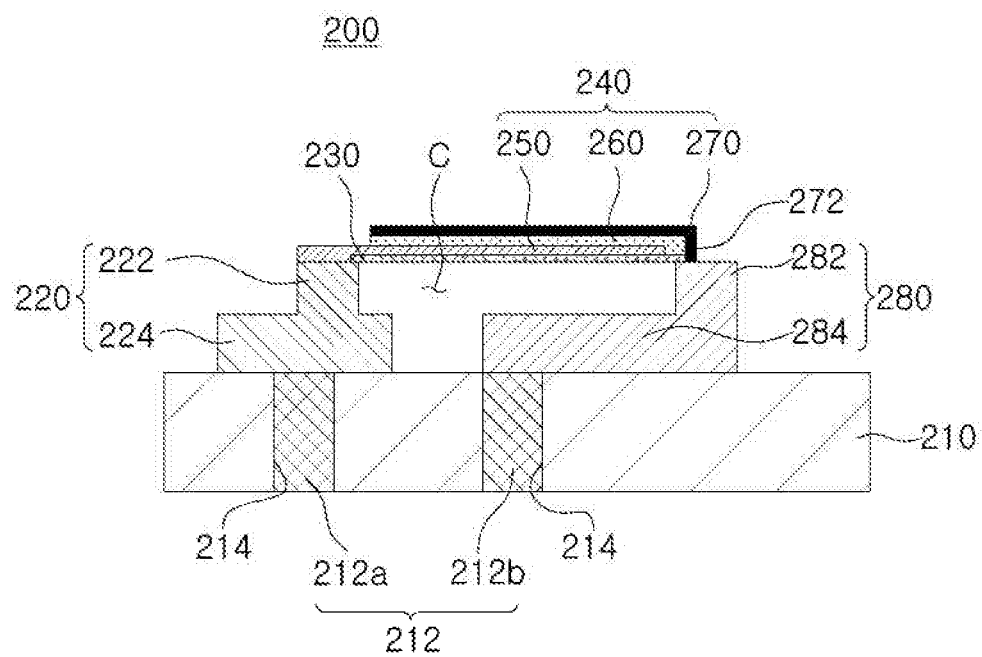
FIG. 2 illustrates a schematic configuration of another example of a bulk acoustic wave resonator.

FIG. 2 illustrates a schematic configuration of another example of a bulk acoustic wave resonator.

Referring to FIG. 2, a bulk acoustic wave resonator 200 includes a substrate 210, a lower electrode connection member 220, a membrane layer 230, a resonant portion 240, an upper electrode connection member 280.

The substrate 210 may be a silicon substrate. For example, a silicon wafer may be used as the substrate 210. A substrate protective layer (not shown) may be provided on the substrate 210.

Via holes 214 are formed in the substrate 210. Vias 212 are formed in the via holes 214. One of the vias 212 is disposed below the resonant portion 240, and the other one of the vias 212 is disposed outside an area below the resonant portion 240 so that the other via 212 is not disposed below the resonant portion 240. The vias 212 include a first via 212a connected to the lower electrode connection member 220, and a second via 212b connected to the upper electrode connection member 280.

The first via 212a is disposed outside of the area below the resonant portion 240 so that the first via 212a is not disposed below the resonant portion 240, and the second via 212b is disposed below the resonant portion 240.

Further, the second via 212b is disposed below a central portion of the resonant portion 240.

The lower electrode connection member 220 is disposed on the substrate 110 and supports an edge portion of the resonant portion 240. The lower electrode connection member 220 is electrically connected to a lower electrode 250 of the resonant portion 240, and is electrically connected to the first via 212a.

In the example in FIG. 2, the lower electrode connection member 220 includes a lower electrode connection support portion 222 supporting an edge portion of the resonant portion 240 and connected to the lower electrode 250, and an extension portion 224 extending from the lower electrode connection support portion 222 parallel to an upper surface of the substrate 210 and connected to the via 212.

In the example in FIG. 2, the extension portion 224 extends outwardly away from the area below the resonant portion 240 so that the extension portion 224 is disposed outside the area below the resonant portion 240 and is not disposed below the resonant portion 240, and is connected to the first via 212a disposed outside the area below the resonant portion 240.

Since the lower electrode connection member 220 includes the extension portion 224 as described above, a position of the first via 212a electrically connected to the lower electrode 250 of the resonant portion 240 through the lower electrode connection member 220 may be changed, thereby increasing the degree of freedom of a position at which the first via 212a may be formed.

The lower electrode connection member 220 is made of a conductive material, such as copper (Cu) or tungsten (W), for example.

The membrane layer 230 forms a cavity C together with the lower electrode connection member 220 and the upper electrode connection member 280. The membrane layer 230 is disposed so that edge portions thereof are supported by the lower electrode connection member 220 and the upper electrode connection member 280. As an example, the membrane layer 230 may be formed of a material, such as silicon dioxide ($SiO_2$) or aluminum nitride (AlN), having relatively a low reactivity with a halide-based etching gas. For example, the membrane layer 230 may be formed of either one or both of silicon dioxide ($SiO_2$) or aluminum nitride (AlN).

The resonant portion 240 is disposed on the membrane layer 230 and connected to the lower electrode connection member 220 and the upper electrode connection member 280. In the example in FIG. 2, the resonant portion 240 includes the lower electrode 250, a piezoelectric layer 260, and an upper electrode 270.

The lower electrode 250 is disposed on the membrane layer 230 and connected to the lower electrode connection member 220. The lower electrode 250 is disposed above the cavity C. As an example, the lower electrode 250 may be made of a conductive material, such as molybdenum (Mo), ruthenium (Ru), tungsten (W), iridium (Ir), platinum (Pt), or any other suitable conductive material, or an alloy of any two or more of these conductive materials.

The piezoelectric layer 260 is disposed on the lower electrode 250 and the membrane layer 230, and has one side coplanar with one side of the membrane layer 230.

As an example, the piezoelectric layer 260 may be formed by depositing aluminum nitride, doped aluminum nitride, zinc oxide, or lead zirconate titanate on the lower electrode 250 and the membrane 230.

If the piezoelectric layer 260 is made of aluminum nitride (AlN), it may further include a rare earth metal. As the rare earth metal, for example, any one or any combination of any two or more of scandium (Sc), erbium (Er), yttrium (Y), and lanthanum (La) may be used. In addition, the piezoelectric layer 260 made of aluminum nitride (AlN) may further include a transition metal. For example, as the transition metal, any one or any combination of any two or more of zirconium (Zr), titanium (Ti), magnesium (Mg), and hafnium (Hf) may be used. Thus, the piezoelectric layer 260 made of aluminum nitride (AlN) may include one or more rare earth metals, or one or more transition metals, or both one or more rare earth metals and one or more transition metals.

The upper electrode 270 is disposed on an upper surface of the piezoelectric layer 260. As an example, the upper electrode 270 is made of a conductive material, such as molybdenum (Mo), ruthenium (Ru), tungsten (W), iridium (Ir), platinum (Pt), or any other suitable conductive material, or an alloy of any two or more of these conductive materials, in the same manner as the lower electrode 250.

The upper electrode 270 is disposed on the piezoelectric layer 260 so that the upper electrode 270 is disposed above the cavity C. In the example in FIG. 1, the upper electrode 270 covers an entire upper surface of the piezoelectric layer 260. However, in another example, the upper electrode 270 covers only a portion of the upper surface of the piezoelectric layer 260 so that a remaining portion of the upper surface of the piezoelectric layer 260 is exposed. A portion of the upper electrode 270 covers a side surface of the piezoelectric layer 260. In the example in FIG. 2, the upper electrode 270 includes a connection portion 272 that covers the side surface of the piezoelectric layer 260 and electrically connects the upper electrode 170 to the upper electrode connection member 280.

The upper electrode connection member 280 is disposed on the substrate 210, and has one end connected to the upper electrode 270. The upper electrode connection member 280 and the lower electrode connection member 220 support edge portions of the resonant portion 240.

In the example in FIG. 2, the cavity C is formed by the upper electrode connection member 280, the lower electrode connection member 220, and the membrane layer 230.

The upper electrode connection member 280 includes an upper electrode connection support portion 282 supporting an edge portion of the resonant portion 240 and connected to the upper electrode 270, and an extension portion 284 extending from the upper electrode connection support portion 282 parallel to an upper surface of the substrate 210 and connected to the second via 212b.

Since the upper electrode connection member 280 includes the extension portion 284 as described above, a position of the second via 212b electrically connected to the upper electrode 270 of the resonant portion 240 through the upper electrode connection member 280 may be changed, thereby increasing the degree of freedom of a position at which the second via 212b may be formed.

The upper electrode connection member 280 is made of a conductive material such as copper (Cu) or tungsten (W), for example.

As described above, the degree of freedom of positions at which the vias 212 may be formed is increased by the lower electrode connection member 220 having the extension portion 224 and the upper electrode connection member 280 having the extension portion 284.

Thus, an area occupied by the bulk acoustic wave resonator 200 may be reduced.

Figure 3:
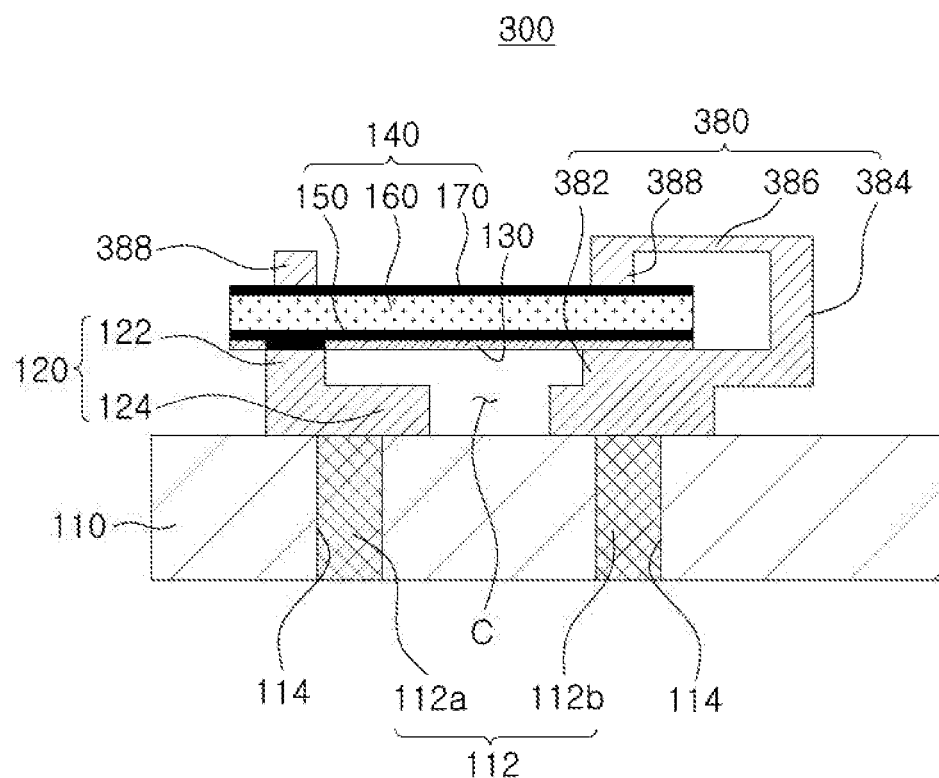
FIG. 3 illustrates a schematic configuration of another example of a bulk acoustic wave resonator.

FIG. 3 illustrates a schematic configuration of another example of a bulk acoustic wave resonator.

Referring to FIG. 3, a bulk acoustic wave resonator 300 includes a substrate 110, a lower electrode connection member 120, a membrane layer 130, a resonant portion 140, and an upper electrode connection member 380.

The substrate 110, the lower electrode connection member 120, the membrane layer 130, the resonant portion 140, a lower electrode 150, a piezoelectric layer 160, and an upper electrode 170 are similar to the corresponding elements of the example of the bulk acoustic wave resonator 100 illustrated in FIG. 1, and thus a detailed description of these elements has been omitted here, and reference is made to the description of the similar elements in connection with FIG. 1 above.

The upper electrode connection member 380 is disposed on the substrate 110, and has one end connected to the upper electrode 170. The upper electrode connection member 380 and the lower electrode connection support member 120 support the resonant portion 140.

In the example in FIG. 3, a cavity C is formed by the upper electrode connection member 380, the lower electrode connection member 120, and the membrane layer 130.

The upper electrode connection member 380 includes an upper electrode connection support portion 382 supporting a an edge portion of the resonant portion 140 that is wider than the edge portion of the resonant portion 140 supported by the upper electrode connection member 180 in FIG. 1, a column portion 384 extending upwardly from an edge portion of the upper electrode connection support portion 382, a plate portion 386 extending from an end portion of the column portion 384 parallel to an upper surface of the substrate 110, and a connection portion 388 disposed on an upper surface of the upper electrode 170 and connected to the plate portion 386. As can be seen from FIG. 3, the upper electrode connection support portion 382 includes an extension portion like the extension portion 124 of the lower electrode connection support member 120.

A portion of the upper electrode connection support portion 382 is disposed outside an area below the resonant portion 140, and the column portion 384 extends upwardly from an edge portion of the upper electrode connection support portion 382 disposed outside the area below the resonant portion 140.

In the example in FIG. 3, the connection portion 388 is disposed near an edge of an upper surface of the upper electrode 170. The connection portion 388 may have an annular shape corresponding to a shape of the resonant portion 140, for example, an amorphous annular shape. An amorphous annular shape is an annular shape having any desired outside contour. Although it appears that there are two connection portions 388 in FIG. 3, these are actually part of a single connection portion 388 having an annular shape that is shown in cross-section in FIG. 3.

The upper electrode connection member 380 is made of a conductive material such as copper (Cu) or tungsten (W), for example.

As described above in connection with FIGS. 1 and 2, the degree of freedom of positions at which the vias 112 may be formed is increased by the lower electrode connection member 120 having the extension portion 124 and the upper electrode connection member 380 having the extension portion like the extension portion 124 of the lower electrode connection member 120.

Figure 4:
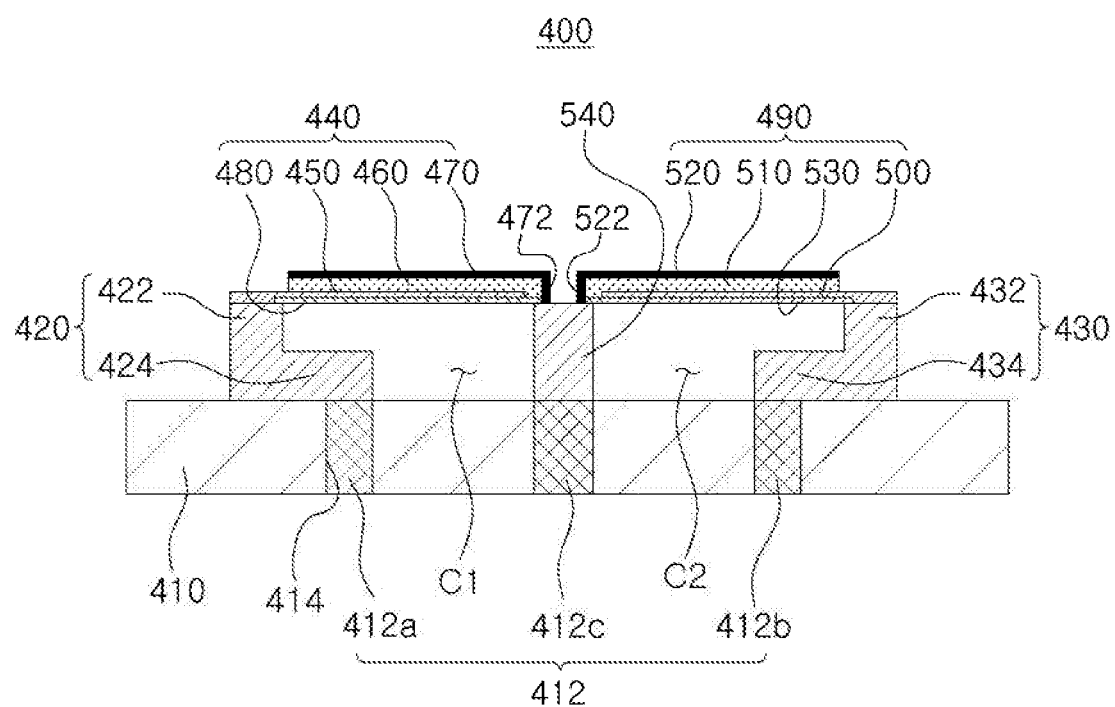
FIG. 4 illustrates a schematic configuration of another example of a bulk acoustic wave resonator.

FIG. 4 illustrates a schematic configuration of another example of a bulk acoustic wave resonator.

Referring to FIG. 4, a bulk acoustic wave resonator 400 includes a substrate 410, a first lower electrode connection member 420, a second lower electrode connection member 430, a first resonant portion 440, a second resonant portion 490, and an upper electrode connection member 540.

The substrate 410 may be a silicon substrate. For example, a silicon wafer may be used as the substrate 410. A substrate protective layer (not shown) may be provided on the substrate 410.

Via holes 414 are formed in the substrate 410. Vias 412 are formed in the via holes 414 and are connected to the first lower electrode connection member 420, the second lower electrode connection member 430, and the upper electrode connection member 540. The vias 412 include a first via 412a connected to the first lower electrode connection member 420, a second via 412b connected to the second lower electrode connection member 430, and a third via 412c connected to the upper electrode connection member 540. The first and second vias 412a and 412b are disposed below the first and second resonant portions 440 and 490, respectively.

When the substrate 410 is mounted on a main substrate (not shown), solder balls are formed in the first, second, and third vias 412a, 412b, and 412c to mount the substrate 410 on the main substrate. In the example in FIG. 4, the vias 412 include three vias, but the number of the vias 412 is not limited thereto. For example, the vias 412 may include four or more vias.

The first lower electrode connection member 420 is disposed on the substrate 410 and connected to the first via 412a. The first lower electrode connection member 420 includes a first lower electrode connection support portion 422 supporting an edge portion of the first resonant portion 440, and an extension portion 424 extending from the first lower electrode connection support portion 422 parallel to an upper surface of the substrate 410 and connected to the first via 412a.

Since the first lower electrode connection member 420 includes the extension portion 424 as described above, a position of the first via 412a electrically connected to a lower electrode 450 of the first resonant portion 440 may be changed, thereby increasing the degree of freedom of a position at which the first via 412a may be formed.

The first lower electrode connection member 420 is made of a conductive material, such as copper (Cu) or tungsten (W), for example.

The second lower electrode connection member 430 is spaced apart from the first lower electrode connection member 420 and the upper electrode connection member 540, and is connected to the second via 412b. The second lower electrode connection member 430 includes a second lower electrode connection support portion 432 supporting an edge portion of the second resonant portion 490, and an extension portion 434 extending from the second lower electrode connection support portion 432 parallel to an upper surface of the substrate 410 and connected to the second via 412b.

Since the second lower electrode connection member 430 includes the extension portion 434 as described above, a position of the second via 412b electrically connected to a lower electrode 500 of the second resonant portion 490 may be changed, thereby increasing the degree of freedom of a position at which the second via 412b may be formed.

The second lower electrode connection member 430 is made of a conductive material, such as copper (Cu) or tungsten (W), for example.

The first resonant portion 440 is electrically connected to the first lower electrode connection member 420 and the upper electrode connection member 540. The first lower electrode connection member 420 and the upper electrode connection member 540 support a lower surface of the first resonant portion 440 at edge portions of the first resonant portion 440.

The first resonant portion 440 includes the first lower electrode 450, a first piezoelectric layer 460, a first upper electrode 470, and a first membrane layer 480.

The first lower electrode 450 is disposed on the first membrane layer 480 and connected to the first lower electrode connection member 420. The first lower electrode 450 is disposed above a first cavity C1. As an example, the first lower electrode 450 is made of a conductive material, such as molybdenum (Mo), ruthenium (Ru), tungsten (W), iridium (Ir), platinum (Pt), or any other suitable conductive material, or an alloy of any two or more of these conductive materials.

The first piezoelectric layer 460 is disposed on the first lower electrode 450 and the first membrane layer 480, and has one side coplanar with one side of the membrane layer 130.

As an example, the first piezoelectric layer 460 may be formed by depositing aluminum nitride, doped aluminum nitride, zinc oxide, or lead zirconate titanate on the first lower electrode 450 and the first membrane layer 480.

If the first piezoelectric layer 460 is made of aluminum nitride (AlN), it may further include a rare earth metal. As the rare earth metal, for example, any one or any combination of any two or more of scandium (Sc), erbium (Er), yttrium (Y), and lanthanum (La) may be used. In addition, the first piezoelectric layer 460 made of aluminum nitride (AlN) may further include a transition metal. For example, as the transition metal, any one or any combination of any two or more of zirconium (Zr), titanium (Ti), magnesium (Mg), and hafnium (Hf) may be used. Thus, the first piezoelectric layer 460 made of aluminum nitride (AlN) may include one or more rare earth metals, or one or more transition metals, or both one or more rare earth metals and one or more transition metals.

The first upper electrode 470 is disposed on an upper surface of the first piezoelectric layer 460. As an example, the first upper electrode 470 is made of a conductive material, such as molybdenum (Mo), ruthenium (Ru), tungsten (W), iridium (Ir), platinum (Pt), or any other suitable conductive material, or an alloy of any two or more of these conductive materials, in the same manner as the first lower electrode 450.

The first upper electrode 470 is disposed on the first piezoelectric layer 460 so that the first upper electrode 470 is disposed above the first cavity C1. In the example in FIG. 4, the first upper electrode 470 covers an entire upper surface of the first piezoelectric layer 460. However, in another example, the first upper electrode 470 covers only a portion of the upper surface of the first piezoelectric layer 460 so a remaining portion of the first piezoelectric layer 460 is exposed. A portion of the first upper electrode 470 covers a side of the first piezoelectric layer 460. In the example in FIG. 4, the first upper electrode 470 includes a first connection portion 472 that covers a side surface of the first piezoelectric layer 460 and electrically connects the first upper electrode 170 to the upper electrode connection member 540.

The first membrane layer 480 forms the first cavity C1 together with the first lower electrode connection member 420 and the upper electrode connection member 540. The first membrane layer 480 is disposed so that edge portions thereof are supported by the first lower electrode connection member 420 and the upper electrode connection member 540. As an example, the first membrane layer 480 may be formed of a material, such as silicon dioxide ($SiO_2$) and aluminum nitride (AlN), having a relatively low reactivity with a halide-based etching gas. For example, the first membrane layer 480 may be formed of either one or both of silicon dioxide ($SiO_2$) or aluminum nitride (AlN).

The second resonant portion 490 is electrically connected to the second lower electrode connection member 430 and the upper electrode connection member 540. The second lower electrode connection member 430 and the upper electrode connection member 540 support a lower surface of the second resonant portion 490 at edge portions of the second resonant portion 490.

The second resonant portion 490 includes the second lower electrode 500, a second piezoelectric layer 510, a second upper electrode 520, and a second membrane layer 530.

The second lower electrode 500 is disposed on the second membrane layer 530 and connected to the second lower electrode connection member 430. The second lower electrode 500 is disposed above a second cavity C2. As an example, the second lower electrode 500 is made of a conductive material, such as molybdenum (Mo), ruthenium (Ru), tungsten (W), iridium (Ir), platinum (Pt), or any other suitable conductive material, or an alloy of any two more or more of these conductive materials.

The first second piezoelectric layer 510 is disposed on the second lower electrode 500 and the second membrane layer 530, and has one side coplanar with one side of the membrane layer 530.

As an example, the second piezoelectric layer 510 may be formed by depositing aluminum nitride, doped aluminum nitride, zinc oxide, or lead zirconate titanate on the second lower electrode 500 and the second membrane layer 530.

If the second piezoelectric layer 510 is made of aluminum nitride (AlN), it may further include a rare earth metal. As the rare earth metal, for example, any one or any combination of any two or more of scandium (Sc), erbium (Er), yttrium (Y), and lanthanum (La) may be used. In addition, the second piezoelectric layer 510 made of aluminum nitride (AlN) may further include a transition metal. For example, as the transition metal, any one or any combination of any two or more of zirconium (Zr), titanium (Ti), magnesium (Mg), and hafnium (Hf) may be used. Thus, the second piezoelectric layer 510 made of aluminum nitride (AlN) may include one or more rare earth metals, or one or more transition metals, or both one or more rare earth metals and one or more transition metals.

The second upper electrode 520 is disposed on an upper surface of the second piezoelectric layer 510. As an example, the second upper electrode 520 is made of a conductive material, such as molybdenum (Mo), ruthenium (Ru), tungsten (W), iridium (Ir), platinum (Pt), or any other suitable conductive material, or an alloy of any two or more of these conductive materials, in the same manner as the second lower electrode 500.

The second upper electrode 520 is disposed on the second piezoelectric layer 510 so that the second upper electrode 520 is disposed above the second cavity C2. In the example in FIG. 4, the second upper electrode 520 covers an entire upper surface of the second piezoelectric layer 510. However, in another example, the second upper electrode 520 covers only a portion of the upper surface of the second piezoelectric layer 510 so that a remaining portion of the second piezoelectric layer 510 is exposed. A portion of the second upper electrode 520 covers a side of the second piezoelectric layer 510. In the example in FIG. 4, the second upper electrode 520 includes a second connection portion 522 that covers a side surface of the second piezoelectric layer 510 and electrically connects the second upper electrode 520 to the upper electrode connection member 540.

The second membrane layer 530 forms the cavity second cavity C2 together with the second lower electrode connection member 430 and the upper electrode connection member 540. The second membrane layer 530 is disposed so that edge portions thereof are supported by the second lower electrode connection member 430 and the upper electrode connection member 540. As an example, the second membrane layer 530 may be formed of a material, such as silicon dioxide (SiO$_2$) and aluminum nitride (AlN), having a relatively low reactivity with a halide-based etching gas. For example, the second membrane layer 530 may be formed of either one or both of silicon dioxide (SiO$_2$) or aluminum nitride (AlN).

The upper electrode connection member 540 is spaced apart from the first and second lower electrode connection members 420 and 430, and is connected to the third via 412c. The upper electrode connection member 540 is disposed on the substrate 410, and is connected to the first and second upper electrodes 470 and 520. Further, the upper electrode connection member 540, together with the first and second lower electrode connection members 420 and 430, supports the first and second resonant portions 440 and 490. In the example in FIG. 4, the upper electrode connection member 540 has a columnar shape.

The first cavity C1 is formed by the first lower electrode connection member 420, the upper electrode connection member 540, and the first membrane layer 480. The second cavity C2 is formed by the second lower electrode connection member 430, the upper electrode connection member 540, and the second membrane layer 530.

As an example, the upper electrode connection member 540 is made of a conductive material such as copper (Cu) or tungsten (W), for example.

As described above, the degree of freedom of positions at which the vias 412 may be formed is increased by the first and second lower electrode connection members 420 and 430 having the extension portions 424 and 434, respectively, and the upper electrode connection member 540.

In other words, since the first and second vias 412a and 412b may be formed in the substrate 410 so that the first and second vias 412a and 412b are disposed below the first and second resonant portions 440 and 490, an area occupied by the bulk acoustic wave resonator 400 may be reduced.

As described above, in the examples described above, the degree of freedom of position at which a via may be formed may be increased.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A bulk acoustic wave resonator comprising:
   a substrate comprising a first via and a second via;
   a lower electrode connection member extending away from the substrate;
   a lower electrode disposed on the lower electrode connection member spaced apart from the substrate;
   a piezoelectric layer disposed on the lower electrode;

an upper electrode disposed on the piezoelectric layer; and an upper electrode connection member extending away from the substrate spaced apart from the lower electrode connection member, wherein the lower electrode, the piezoelectric layer, and the upper electrode constitute a resonant portion spaced apart from the substrate, wherein the lower electrode connection member electrically connects the lower electrode to the first via and supports a first edge portion of the resonant portion, wherein the upper electrode connection member electrically connects the upper electrode to the second via and supports a second edge portion of the resonant portion, wherein either one or both of the first via and the second via overlaps the resonant portion, wherein either one or both of the lower electrode connection member and the upper electrode connection member comprises a respective extension portion connected to a respective one of the first via and the second via, and wherein the lower electrode connection member, the upper electrode connection member, and the resonant portion form a cavity above the substrate.

2. The bulk acoustic wave resonator of claim 1, wherein the lower electrode connection member comprises the extension portion connected to the first via, and the upper electrode connection member comprises the extension portion connected to the second via.

3. The bulk acoustic wave resonator of claim 2, wherein both the first via and the second via are disposed below and overlapping the resonant portion.

4. The bulk acoustic wave resonator of claim 2, wherein one of the first via and the second via is disposed below and overlapping the resonant portion, and a remaining one of the first via and the second via is disposed outside an area below the resonant portion.

5. The bulk acoustic wave resonator of claim 1, wherein the upper electrode connection member comprises:

an upper electrode connection support portion connected to the upper electrode and supporting the second edge portion of the resonant portion; and the extension portion extending from the upper electrode connection support portion parallel to an upper surface of the substrate and connected to the second via.

6. The bulk acoustic wave resonator of claim 1, wherein the lower electrode connection member comprises:

a lower electrode connection support portion connected to the lower electrode and supporting the first edge portion of the resonant portion; and the extension portion extending from the lower electrode connection support portion parallel to an upper surface of the substrate and connected to the first via.

7. The bulk acoustic wave resonator of claim 1, wherein the resonant portion further comprises a membrane layer covering the cavity.

8. The bulk acoustic wave resonator of claim 1, wherein the upper electrode comprises a connection portion electrically connecting the upper electrode to the upper electrode connection member.

9. The bulk acoustic wave resonator of claim 1, wherein the upper electrode connection member comprises:

an upper electrode connection support portion supporting the second edge portion of the resonant portion;

a column portion extending upwardly from an edge portion of the upper electrode connection support portion;

a plate portion extending from an end portion of the column portion parallel to an upper surface of the substrate; and a connection portion disposed on an upper surface of the upper electrode and connected to the plate portion.

10. The bulk acoustic wave resonator of claim 9, wherein a portion of the upper electrode connection support portion is disposed outside an area below the resonant portion, and the column portion is disposed on an edge portion of the portion of the upper electrode connection support portion disposed outside the area below the resonant portion.

11. A bulk acoustic wave resonator comprising:

a substrate comprising a first via, a second via, and a third via;

a first lower electrode connection member extending away from the substrate and connected to the first via;

an upper electrode connection member extending away from the substrate spaced apart from the first lower electrode connection member and connected to the third via;

a second lower electrode connection member extending away from the substrate spaced apart from the first lower electrode connection member and the upper electrode connection member and connected to the second via;

a first resonant portion spaced apart from the substrate, electrically connected to the first lower electrode connection member and the upper electrode connection member, and having a lower surface supported by the first lower electrode connection member and the upper electrode connection member; and a second resonant portion spaced apart from the substrate, electrically connected to the second lower electrode connection member and the upper electrode connection member, and having a lower surface supported by the second lower electrode connection member and the upper electrode connection member, wherein any one or any combination of any two or more of the first lower electrode connection member, the second lower electrode connection member, and the upper electrode connection member comprises a respective extension portion connected to a respective one of the first via, the second via, and the third via, wherein any one or any combination of any two or more of the first via, the second via, and the third via overlaps either one or both of the first resonant portion and the second resonant portion, wherein the first lower electrode connection member, the upper electrode connection member, and the first resonant portion form a first cavity above the substrate, and wherein the second lower electrode connection member, the upper electrode connection member, and the second resonant portion form a second cavity above the substrate.

12. The bulk acoustic wave resonator of claim 11, wherein the first lower electrode connection member comprises:

a first lower electrode connection support portion supporting the lower surface of the first resonant portion; and the extension portion extending from the first lower electrode connection support portion parallel to an upper surface of the substrate and connected to the first via.

13. The bulk acoustic wave resonator of claim 11, wherein the second lower electrode connection member comprises:

a second lower electrode connection support portion supporting the lower surface of the second resonant portion; and the extension portion extending from the second lower electrode connection support portion parallel to an upper surface of the substrate and connected to the second via.

14. The bulk acoustic wave resonator of claim 11, wherein the upper electrode connection member has a columnar shape.

15. The bulk acoustic wave resonator of claim 11, wherein the first resonant portion comprises:
- a first lower electrode connected to the first lower electrode connection member;
- a first piezoelectric layer, at least a portion of which is disposed on an upper surface of the first lower electrode; and
- a first upper electrode, at least a portion of which is disposed on an upper surface of the first piezoelectric layer, the first upper electrode being connected to the upper electrode connection member; and the second resonant portion comprises:
- a second lower electrode connected to the second lower electrode connection member;
- a second piezoelectric layer, at least a portion of which is disposed on an upper surface of the second lower electrode; and
- a second upper electrode, at least a portion of which is disposed on an upper surface of the second piezoelectric layer, the second upper electrode being connected to the upper electrode connection member.

16. The bulk acoustic wave resonator of claim 15, wherein the first resonant portion further comprises a first membrane layer having edge portions supported by the first lower electrode connection member and the upper electrode connection member, and the second resonant portion further comprises a second membrane layer having edge portions supported by the second lower electrode connection member and the upper electrode connection member.

17. A bulk acoustic wave resonator comprising:
- a substrate;
- a lower electrode connection member extending away from the substrate;
- an upper electrode connection member extending away from the substrate and spaced apart from the lower electrode member;
- a resonant portion spaced apart from the substrate and having a first end supported by the lower electrode support member and a second end supported by the upper electrode connection member, the resonant portion comprising a lower electrode connected to the lower electrode connection member, an upper electrode connected to the upper electrode connection member, and a piezoelectric layer disposed between the lower electrode and the upper electrode;

wherein either one or both of the lower electrode connection member and the upper electrode connection member comprises:
- an electrode support portion disposed on the substrate and supporting one end of the resonant portion; and
- an extension portion disposed on the substrate and connected to the electrode support portion, the extension portion having a height less than a height of the electrode support portion and not contacting the resonant portion, and wherein the lower electrode connection member, the upper electrode connection member, and the resonant portion form a cavity above the substrate.

18. The bulk acoustic wave resonator of claim 17, wherein the substrate comprises a first via and a second via;

the lower electrode connection member comprises:
- a lower electrode support portion disposed on the substrate, supporting the first end of the resonant portion, and connected to the lower electrode; and
- a first extension portion disposed on the substrate and connected to the first via and the lower electrode support portion, the first extension portion having a height less than a height of the lower electrode support portion and not contacting the resonant portion;

the upper electrode connection member comprises:
- an upper electrode support portion disposed on the substrate, supporting the second end of the resonant portion, and connected to the upper electrode; and
- a second extension portion disposed on the substrate and connected to the second via and the upper electrode support portion, the second extension portion having a height less than a height of the upper electrode support portion and not contacting the resonant portion; and either one or both of the first extension and the second extension overlaps the resonant portion.

19. The bulk acoustic wave resonator of claim 18, wherein both the first extension and the second extension overlap below the resonant portion.

20. The bulk acoustic wave resonator of claim 18, wherein one of the first extension and the second extension overlap the resonant portion, and a remaining one of the first extension and the second extension does not overlap the resonant portion.

* * * * *